United States Patent
Kozaru et al.

[19]

[11] Patent Number: 5,929,539
[45] Date of Patent: Jul. 27, 1999

[54] SEMICONDUCTOR MEMORY DEVICE ADAPTABLE TO EXTERNAL POWER SUPPLIES OF DIFFERENT VOLTAGE LEVELS

[75] Inventors: Kunihiko Kozaru; Tomohisa Wada, both of Hyogo, Japan

[73] Assignee: Mitsubishi Denki Kabushiki Kaisha, Tokyo, Japan

[21] Appl. No.: 08/897,614

[22] Filed: Jul. 21, 1997

[30] Foreign Application Priority Data

Nov. 7, 1996 [JP] Japan ................................. 8-295147

[51] Int. Cl.$^6$ ....................................................... H02J 1/10
[52] U.S. Cl. ................................ 307/85; 307/75; 307/80; 307/130; 363/147; 363/142
[58] Field of Search .............................. 363/142; 307/72, 307/75, 80, 81, 82, 85, 83, 87, 130, 131, 186, 140; 327/540, 541; 365/226

[56] References Cited

U.S. PATENT DOCUMENTS

| 5,291,455 | 3/1994 | Feng et al. ............................... | 365/226 |
| 5,347,170 | 9/1994 | Hayakawa et al. ................... | 365/296.1 |
| 5,426,616 | 6/1995 | Kajigaya et al. ........................ | 307/65 |
| 5,483,152 | 1/1996 | Hardee et al. ........................... | 323/314 |
| 5,615,151 | 3/1997 | Furuno et al. ........................... | 365/226 |
| 5,627,412 | 5/1997 | Beard ....................................... | 307/80 |

FOREIGN PATENT DOCUMENTS 5-258566  10/1993  Japan .

OTHER PUBLICATIONS

Furuyama et al. "*A New On–Chip Voltage Converter for Submicrometer High–Density Dram's*", Jun. 3, 1987, pp. 437–441.

*Primary Examiner*—Robert E. Nappi
*Assistant Examiner*—Derek J. Jardieu
*Attorney, Agent, or Firm*—McDermott, Will & Emery

[57] ABSTRACT

A semiconductor memory device includes a plurality of external power supply pads P1 to P3. Connection between external power supply pads P1 to P3 and an external power supply is determined in accordance with the voltage of the external power supply to be used, and the connection is switched by bonding. External power supply of a high voltage level is connected to an external power supply pad P2 which is connected to VDC1 and VDC2. A circuit including memory cells operates using the voltage applied from VDC1 or external power supply pad P3, while a group of word line drivers operates using the voltage applied from VDC2 or external power supply pad P1. VDC1 down converts the external power supply voltage, and VDC2 down converts it in accordance with the level of the voltage of the external power supply voltage, and generates internal power supply voltages, respectively. Accordingly, a semiconductor memory device which operates adapted to different external power supplies can be obtained.

7 Claims, 7 Drawing Sheets

SEMICONDUCTOR MEMORY DEVICE ADAPTABLE TO EXTERNAL POWER SUPPLIES OF DIFFERENT VOLTAGE LEVELS

BACKGROUND OF THE INVENTION

1. Field of the Invention

The present invention relates to a semiconductor memory device and, more specifically, to a semiconductor memory device having an internal voltage down converter, which is adaptable to external power supplies of different voltage levels.

2. Description of the Background Art

Semiconductor memory devices come to have ever higher density and ever higher degree of integration as elements constituting the devices have been reduced in size. For example, under 0.4 micron design rule, thickness of a gate oxide film in an insulated gate type field effect transistor (hereinafter referred to as an MOS transistor) which is one of the elements constituting the device is about 100 Å, which is extremely thin as compared with the conventional ones.

As it is miniaturized, withstanding capability of the gate oxide film in the MOS transistor has been degraded. It does not present any problem when an external power supply of 3.3V, which is now dominant, is used. However, when an external power supply of 5V, which has been used conventionally, is applied, the withstanding capability is exceeded, and therefore reliability can not be ensured.

Therefore, it is a general practice to lower the external power supply voltage internally and to use the internal power supply voltage to ensure reliability of the elements, when an external power supply of 5V is used.

FIG. 6 is a schematic block diagram showing an overall structure of a semiconductor memory device using a conventional external power supply of 5V. A semiconductor memory device 200 includes an external power supply pad P4, an internal voltage down converter 50 (hereinafter referred to as VDC 50), an internal circuitry 52, and an external power supply using circuit 53.

External power supply pad P4 is connected to the external power supply and receives external power supply voltage ExtVcc from the external power supply. VDC 50 is connected to external power supply pad P4 and a ground node Vss, down converts the external power supply voltage ExtVcc applied to external power supply pad P4 and generates an internal power supply voltage intV.

Internal circuitry 52 is connected to VDC 50. An example of the internal circuitry 52 is a memory cell array including a plurality of memory cells. Therefore, an MOS transistor which is an element of the memory cell array operates using the internal power supply voltage intV provided by down converting external power supply voltage ExtVcc as its operational power supply.

External power supply using circuit 53 operates receiving external power supply voltage ExtVcc. One example is a circuit for processing related to data input/output.

When the external power supply is 3.3V, internal circuitry 52 is directly connected to external power supply pad P4. Conventionally, a current mirror type internal voltage down converter has been known as such VDC 50.

FIG. 7 is a schematic block diagram showing an overall structure of the conventional current mirror type internal voltage down converter. VDC 50 includes a P channel MOS transistor (hereinafter referred to as PMOS) MP6, and a current mirror type differential amplifier 51 for switching PMOS MP6.

Differential amplifier 51 receives at its negative input a reference voltage VREF supplied from a reference voltage generating circuit, not shown. Its positive input is connected to one conduction terminal of PMOS MP6 through a node E, and receives internal power supply voltage intV generated on node E.

Differential amplifier 51 compares internal power supply voltage intV on node E and reference voltage VREF, amplifies and outputs a control voltage VOUT.

PMOS MP6 has the other conduction terminal connected to external power supply pad P4 and receives external power supply voltage ExtVcc from the external power supply. The one conduction terminal is connected to differential amplifier 51 through node E, as described above. Its gate receives control voltage VOUT which is an output from differential amplifier 51.

Based on control voltage VOUT, PMOS MP6 adjusts current supply from external power supply voltage ExtVcc to node E. As a result, voltage level of internal power supply voltage intV on node E is kept constant.

However, the conventional semiconductor memory device 200 shown in FIG. 6 having the above described structure is adaptable to only one external power supply.

Meanwhile, though external power supply voltage of 3.3V has come to be dominant instead of 5V for a semiconductor memory devices, the power supply of 5V is still required for some uses.

Therefore, in order to be compatible for different external power supplies, it is necessary in the step of manufacturing the semiconductor memory device to produce mask patterns in accordance with voltage levels of the external power supplies (more specifically, two different mask patterns for the external power supply of 3.3V and the external power supply of 5V).

Further, the conventional VDC 50 used for the external power supply of 5V has the following problem.

More specifically, VDC 50 is adapted to adjust voltage level of internal power supply voltage intV based on feedback control. Therefore, there is a time lag from the feedback of internal power supply voltage intV to the differential amplifier 51 until the voltage level of the internal power supply voltage intV actually changes.

When the time lag is large, current supply from external power supply voltage ExtVcc to node E shown in FIG. 7 cannot follow, resulting in temporary voltage drop, and hence the speed of operation cannot be ensured. The same phenomenon is observed when the external power supply voltage ExtVcc lowers by some cause.

Further, since VDC 50 is formed of a feedback loop, when the feedback cannot follow the change in the internal power supply voltage intV, internal power supply voltage intV would start oscillation.

Further, for the VDC 50, it is necessary to adjust reference voltage VREF in advance, and therefore the step of laser trimming cannot be reduced.

Further, current consumption of the VDC is rather high, and therefore current consumption cannot be reduced at the standby state.

Further, in order to realize stable operation of VDC 50, a relatively high capacitance is necessary, and therefore the chip size cannot be made smaller.

These problems are common in all semiconductor memory devices including VDC 50. However, the influence is especially serious for a high speed static random access memory (hereinafter referred to as high speed SRAM) when operation specification thereof is to be satisfied.

SUMMARY OF THE INVENTION

An object of the present invention is to provide a semiconductor memory device which is adaptable to any external power supply.

Another object of the present invention is to provide a semiconductor memory device having an internal voltage down converter for down converting, when an external power supply of a high voltage level is used, the external power supply rapidly to generate an internal power supply voltage.

A still further object of the present invention is to provide a semiconductor memory device having an internal voltage down converter ensuring memory cell operation when an external power supply of a high voltage level is used and the voltage level happens to lower, by increasing the voltage level of the internal power supply voltage to be generated.

The semiconductor memory device in accordance with the present invention is adaptable to both a first external power supply and a second external power supply of which voltage level is higher than the voltage level of the first external power supply. The semiconductor memory device includes a plurality of first external power supply pads which are connected to the first external power supply when the first external power supply is used and not connected when the second external power supply is used; at least one second external power supply pad connected to the external power supply no matter which of the external power supplies is used; a plurality of internal voltage down converting circuits connected to the second external power supply pad for down converting the voltage on the second external power supply pad for generating internal power supply voltages respectively; a plurality of internal power supply lines to which output nodes of the plurality of internal down converting circuits and the plurality of first external power supply pads are connected correspondingly; and a plurality of internal circuits connected to the plurality of internal power supply lines and operating receiving the voltage on the internal power supply lines. Connection between the first and second external power supply pads and the external power supply used is switched by bonding.

In the semiconductor memory device of the present invention, a plurality of external power supply pads are provided and internal voltage down circuits are connected to specific ones of the external power supply pads. Therefore, by appropriately selecting an external power supply pad to be used based on the external power supply to be used at the time of bonding, the device is adaptable to any external power supply voltage of any voltage level.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
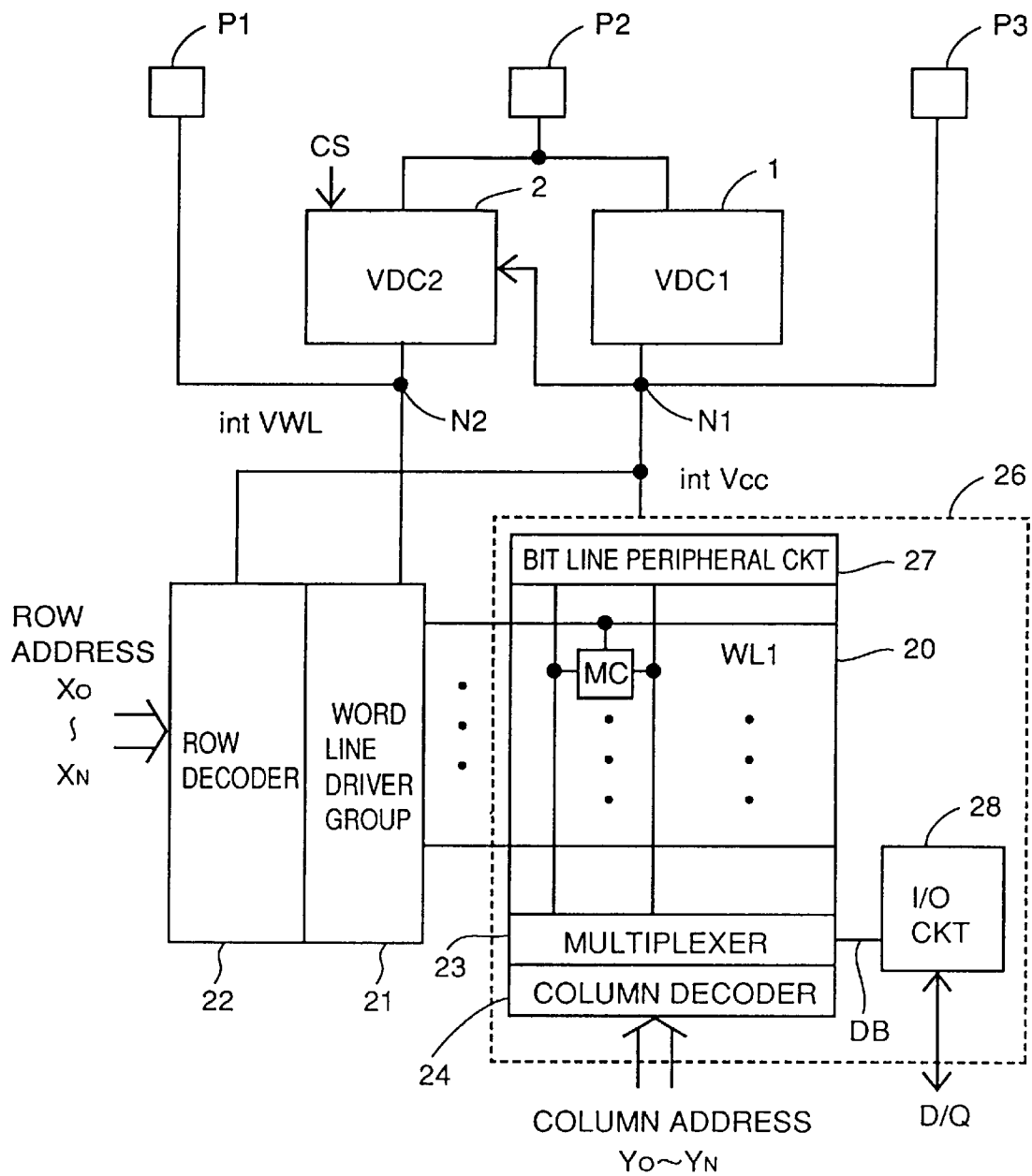
FIG. 1 is a schematic block diagram showing an overall structure of a semiconductor memory device in accordance with an embodiment of the present invention.

The overall structure of a semiconductor memory device 100 in accordance with one embodiment of the present invention will be described with reference to FIG. 1.

Semiconductor memory device 100 in accordance with the embodiment of the present invention differs from the conventional semiconductor memory device 200 in that external power supply pads P1, P2 and P3 are provided as external power supply pads receiving external power supply voltages, and that internal voltage down converters 1 and 2 are provided in place of internal voltage down converter 50. In the following, internal voltage down converter 1 will be referred to as VDC1, and internal voltage down converter 2 will be referred to as VDC2.

External power supply pad P2 is connected to VDC1 and VDC2, and supplies to these circuits a current applied from the external power supply. External power supply pad P1 is connected to a node N2 which is an output node of VDC2, and external power supply pad P3 is connected to a node N1 which is an output node of VDC1. Node N1 is connected to a row decoder 22 and to an internal circuitry 26 including a memory cell array 20. Node N2 is connected to a group of word line drivers 21.

Memory cell array 20 includes a plurality of memory cells MC arranged in a matrix of rows and columns, and each memory cell is connected to a word line WL in the row direction.

Row decoder 22 receives internal row address signals $X_o$ to $X_n$ corresponding to externally applied address signals, and selects a word line WL in the memory cell array. The group of word line drivers 21 is connected to each word line WL of memory cell array 20, receives a decode signal from row decoder 22, and raises potential of the selected word line WL.

Internal circuitry 26 including memory cell array 20 further includes a column decoder 24, a multiplexer 23, a bit line peripheral circuitry 27 and an input/output circuit 28. Column decoder 24 receives internal column address signals $Y_0$ to $Y_n$ corresponding to externally applied address signals, and select a bit line BL of the memory cell array. Multiplexer 23 connects the bit line BL selected by column decoder 24 to a data bus DB. Bit line peripheral circuitry 27 is connected to bit lines BL of memory cell array 20 and applies a bias voltage to memory cells MC. Input/output circuit 28 is connected to data bus DB and performs a process for inputting external data to memory cells MC or a process for outputting data of memory cells MC transmitted to data bus DB to the outside.

Connection between external power supply pads P1, P2 and P3 and the external power supply is switched by bonding, in accordance with the power supply voltage of the external power supply to be used. More specifically, when 3.3V is used as the external power supply, external power supply pads P1, P2 and P3 are connected to the external power supply of 3.3V by a bonding wire. Meanwhile, when 5V is used as the external power supply, external power supply pads P1 and P3 are not connected, and external power supply pad P2 is connected to the external power supply of 5V by a bonding wire.

As a result, when 5V is used as the external power supply, VDC1 and VDC2 down convert the external power supply voltage (hereinafter referred to as ExtVcc) received by external power supply pad P2 and generate an internal power supply voltage on nodes N1 and N2 which are output nodes, respectively. The down converted internal power supply voltage is used as an operational power supply for the circuits constituting semiconductor memory device 100.

Meanwhile, when 3.3V is used as the external power supply, as will be described later, VDC1 and VDC2 do not operate, and external power supply voltage received by external power supply pads P1 and P3 is used as the operational power supply for the circuits constituting semiconductor memory device 100.

Accordingly, semiconductor memory device 100 can be used with the external power supply of 5V as well as 3.3V. Unlike the conventional practice, it is not necessary to prepare mask patterns (two different mask patterns for 5V and 3.3V) in accordance with the external power supplies in the step of manufacturing the semiconductor memory device.

In the following, for simplicity, voltage on node N1 (in case of 3.3V, external power supply pad P3) will be referred to as intVcc, the voltage on node N2 (in case of 3.3V, external power supply pad P1) will be referred to as intVWL and the external voltage on external power supply pad P2 will be referred to as ExtVcc.

Figure 2:
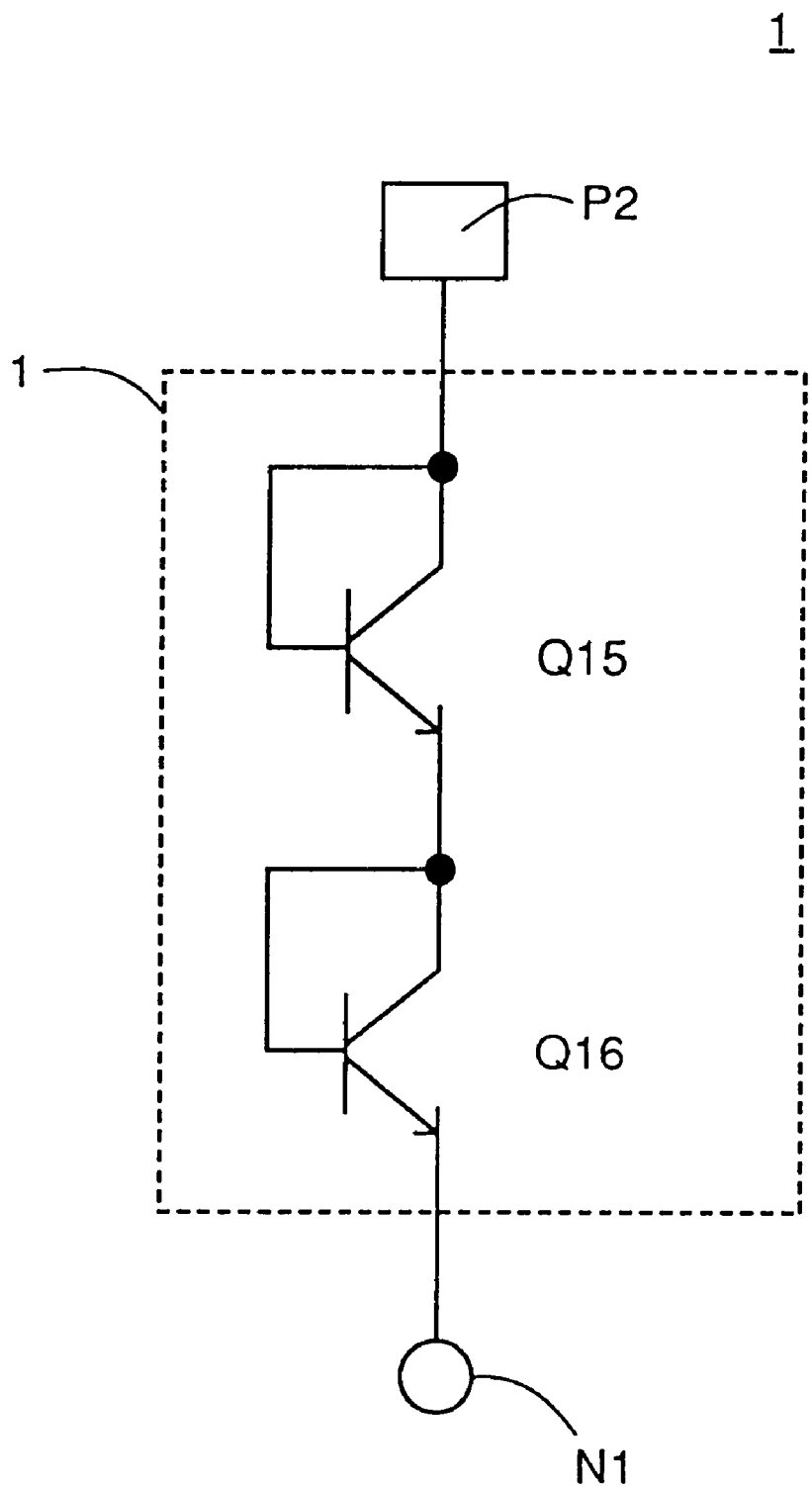
FIG. 2 is a circuit diagram showing an overall structure of one internal voltage down converter in accordance with an embodiment of the present invention.

The overall structure of internal voltage down converter 1 (VDC1) in accordance with an embodiment of the present invention will be described with reference to FIG. 2.

VDC1 down converts external power supply voltage ExtVcc applied to external power supply pad P2 and generates internal power supply voltage intVcc. Internal power supply voltage intVcc serves as an operational power supply for row decoder 22 and circuitry 26 including memory cell array 20 in semiconductor memory device 100.

The operation of VDC1 will be described with reference to FIG. 2. VDC1 includes bipolar transistors Q15 and Q16. Bipolar transistors Q15 and Q16 are connected in series. Bipolar transistor Q15 has one conduction terminal connected to external power supply pad P2. Bipolar transistor Q16 has one conduction terminal connected to node N1.

When the voltage between the base and emitter of bipolar transistors Q15 and Q16 is represented by Vbe, the internal power supply voltage intVcc obtained on node N1 is represented by the following equation (1).

$$IntVcc = ExtVcc - 2Vbe \quad (1)$$

where Vbe generally has a voltage value of about 0.8V.

Therefore, when the range of fluctuation of external power supply voltage ExtVcc supplied by the external power supply of 5V is within ±10%, the internal power supply voltage intVcc on node N1 will be 2.9V to 3.9V in accordance with the equation (1), with respect to the possible voltage range (4.5V to 5.5V) of the external power supply voltage ExtVcc.

As described above, since VDC1 utilizes bipolar transistors, it can follow abrupt change of load in wide frequency range, because of high drivability and high speed of operation of the transistors. Further, since it does not include a feedback loop, there is no possibility of oscillation.

When transistors of smaller size are to be used with the withstanding property of the oxide film in the transistors being lower, the same effect can be obtained without damaging the gate oxide films of the transistors when three stages of bipolar transistors constituting the VDC1 are connected in series.

Figure 3:
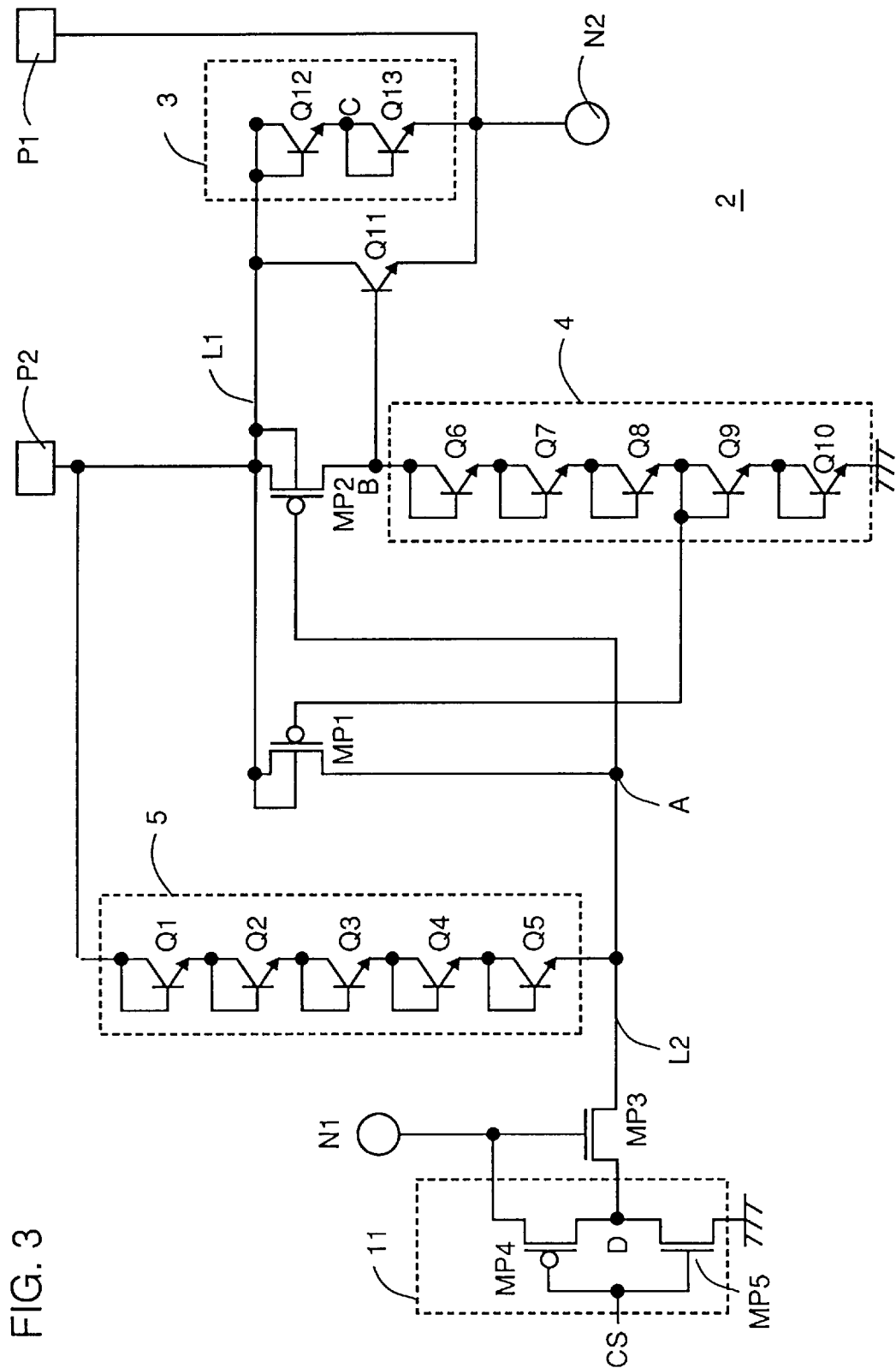
FIG. 3 is a circuit diagram showing an overall structure of another internal voltage down converter in accordance with an embodiment of the present invention.

Overall structure of internal voltage down converter 2 (VDC2) in accordance with an embodiment of the present invention will be described with reference to FIG. 3.

VDC2 down converts external voltage ExtVcc applied to external power supply pad P2 and generates internal power supply voltage intVWL. Internal power supply voltage intVWL serves as an operational power supply of the group of word line drivers 21 of semiconductor memory device 100. VDC2 ensures circuit operation of memory cells MC when external power supply voltage changes to a lower potential.

Figure 4:
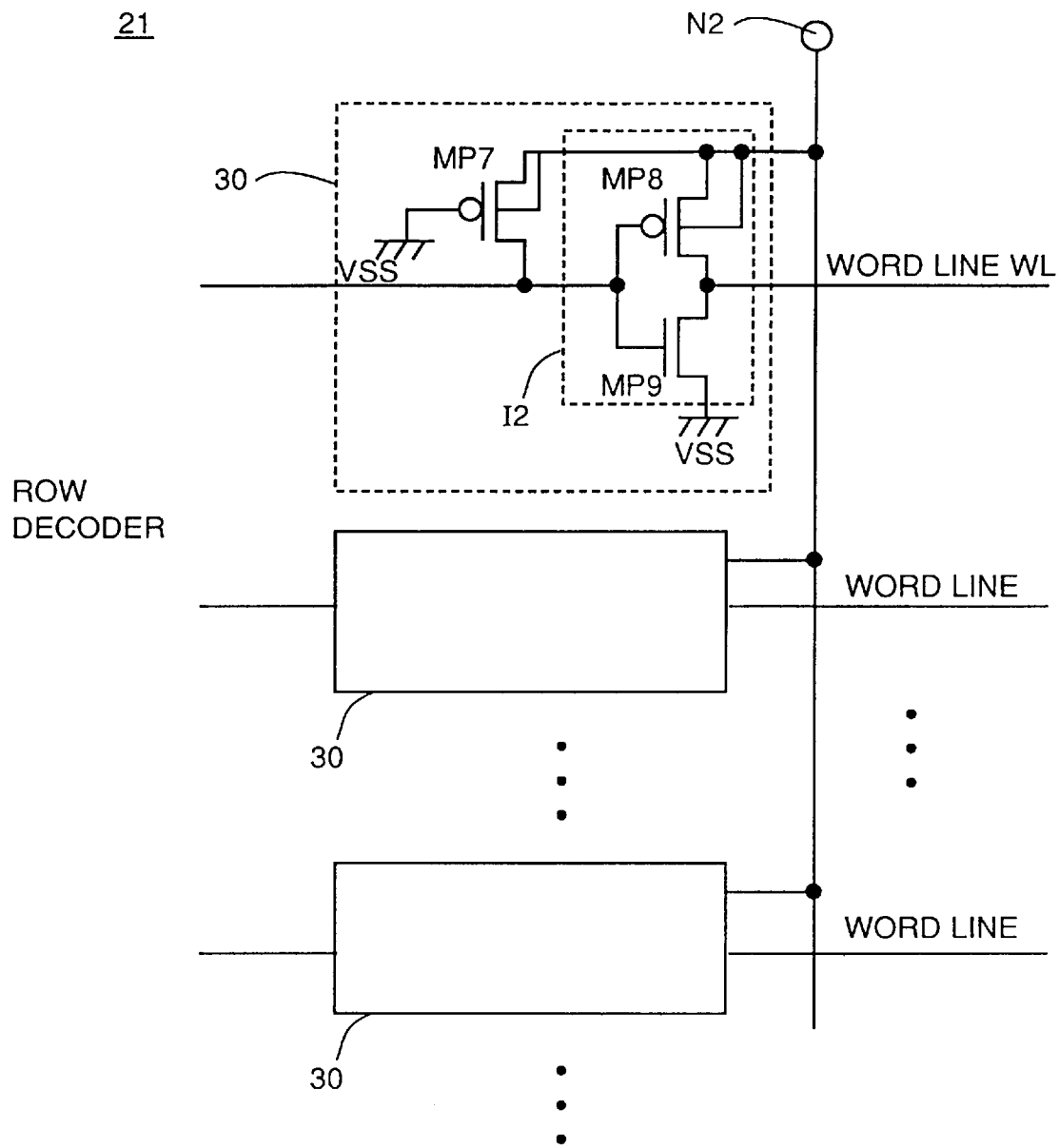
FIG. 4 is a circuit diagram showing an overall structure of a conventional word line driver group.

Referring to FIG. 4, the overall structure of the group of word line drivers 21 will be described. The group of word line drivers 21 refers to a circuit including a plurality of word line drivers 30, and each word line driver 30 includes a PMOS MP7 and an inverter circuit I2. Inverter circuit I2 includes PMOS MP8 and NMOS MP9. PMOS MP8 has one conduction terminal connected to node N2, and NMOS MP9 has one conduction terminal connected to ground node VSS. At a connection node between PMOS MP8 and NMOS MP9, one word line WL is connected. Word line driver 30 receives internal power supply voltage intVWL on node N2 and pulls up the potential of word line WL.

VDC2 will be described with reference to FIG. 3. VDC2 includes a bipolar transistor Q11, and a voltage lowering element 3 including bipolar transistors Q12 and Q13 connected in series. Bipolar transistor Q11 is connected between a signal line L1 and node N2, and it has its base connected to a node B, which will be described later. Node N2 is connected to external power supply pad P1, as mentioned above.

Voltage lowering element 3 is also connected between signal line L1 and node N2. Signal line L1 is connected to external power supply pad P2 and receives external power supply voltage ExtVcc. Bipolar transistor Q11 and voltage lowering element 3 down convert external power supply voltage ExtVcc applied on signal line L1, respectively, and determine the potential on node N2.

VDC2 further includes PMOS MP1, PMOS MP2 and a voltage detecting circuit 4. PMOS MP1 has one conduction terminal connected to signal line L1 and the other conduction terminal connected to a signal line L2 (node A). Its gate is connected to a connection node between bipolar transistors Q8 and Q9 of voltage detecting circuit 4, which will be described later. PMOS MP1 pulls up potential on node A1 at the time of standby. PMOS MP2 has one conduction terminal connected to signal line L1 and the other conduction terminal connected to voltage detecting circuit 4 through node B. PMOS MP2 adjusts current supply from signal line L1 to voltage detecting circuit 4.

Voltage detecting circuit 4 includes bipolar transistors Q6 to Q10 connected in series. Bipolar transistor Q6 has one conduction terminal connected to base of bipolar transistor Q11 through node B, and bipolar transistor Q10 has one conduction terminal connected to ground node Vss. The voltage between the base and emitter of the bipolar transistor will be referred to as Vbe.

Voltage detecting circuit 4 detects lowering of external power supply voltage ExtVcc. More specifically, assume that PMOS MP2 is conductive. When external power supply voltage satisfies $ExtVcc \leq 5Vbe$, voltage detecting circuit 4 is rendered inactive (current does not flow from node B to the ground node VSS). Meanwhile, when external power supply voltage satisfies ExtVcc>5Vbe, it is rendered active (voltage on node B attains to 5Vbe or higher).

VDC2 further includes a clamp circuit 5, an NMOS MP3 and an inverter circuit I1. Clamp circuit 5 includes bipolar transistors Q1 to Q5 connected in series. Bipolar transistor Q1 has its conduction terminal connected to external power supply pad P2. Bipolar transistor Q5 has one conduction terminal connected to signal line L2. Clamp circuit 5 clamps potential on node A and determines lower limit potential thereof.

Inverter circuit I1 includes a PMOS MP4 and an NMOS MP5. Gates of PMOS MP4 and NMOS MP5 both receive an internal chip select signal CS.

The internal chip select signal CS is an inversion of an external chip select signal/CS input through an external/CS pin, not shown, which signal designates access to memory cell MC. Generally, when the semiconductor memory device is in a standby state, the voltage level of external chip select signal/CS is at the H level (in other words, the internal chip select signal CS is at the L level), and when the device is in operation, the voltage level of external chip select signal CS is at the L level (namely, internal chip select signal CS is at the H level).

PMOS MP4 has one conduction terminal connected to node N1, and NMOS MP5 has one conduction terminal connected to ground node VSS. PMOS MP4 is connected to NMOS MP5 at node D. NMOS MP3 has one conduction terminal connected to signal line L2 and the other conduction terminal connected to node D which is a connection node of PMOS MP4 and NMOS MP5. Its gate is connected to node N1 and receives internal power supply voltage intVcc on node N1.

The operation of VDC2 will be described with reference to FIG. 3. First, at the time of standby (when internal chip select signal CS is at the L level), PMOS MP1 is conductive, receiving at its gate the L level voltage, and node A is pulled up to the potential of external power supply voltage ExtVcc. Receiving it at the gate, PMOS MP2 is rendered non-conductive.

Therefore, external power supply pad P2 and voltage detecting circuit 4 are not connected to each other. As a result, standby current flowing from node B through voltage detecting circuit 4 to ground node VSS is reduced.

In the active state (when internal chip select signal CS is at the H level), inverter circuit I1 outputs a signal at the L level. In response, signal line L2 is pulled down to the L level. However, since clamp circuit 5 clamps the potential of signal line L2, a voltage of 5Vbe or higher is not applied between the gate and source of PMOS MP2. Since the potential at node A is at the L level, PMOS MP2 is rendered conductive.

The relation between fluctuation of external power supply voltage ExtVcc and the potential on node N2, that is, internal power supply voltage intVWL will be described.

First, when external power supply voltage ExtVcc is lower than 5Vbe (about 4V), PMOS MP2 is conductive and voltage detecting circuit 4 is inactive. Therefore, the potential on node B attains to the same level as external power supply voltage ExtVcc. Therefore, by the bipolar transistor Q11 receiving the voltage on node B, the potential on node N2 attains to the value represented by the following equation (2).

$$intVWL = ExtVcc - Vbe \quad (2)$$

Meanwhile, when the external power supply voltage ExtVcc is higher than 5Vbe (about 4V), the potential on node B is clamped by voltage detecting circuit 4. However, when the potential of external power supply voltage ExtVcc rises, the voltage detecting circuit 4 does not function as a constant voltage source, and the potential on node B rises moderately. At this time, the potential on node N2 has a value represented by the following equation (3).

$$intVWL = Vb - Vbe \quad (3)$$

where Vb represents potential on node B.

When the potential of external power supply voltage ExtVcc further rises, the potential on node C becomes higher than the potential Vb on node B. Therefore, the potential on node N2 attains to the value represented by the following equation (4), because of voltage lowering element 3.

$$IntVWL = ExtVcc - 2Vbe \quad (4)$$

More specifically, when external power supply voltage ExtVcc is in the normal range of fluctuation, by the function of voltage lowering element 3, internal power supply voltage intVWL attains to (ExtVcc−2Vbe). Meanwhile, when external power supply voltage ExtVcc fluctuates over the normal range of fluctuation and becomes lower than a prescribed potential, voltage detecting circuit 4 detects the lowering of the voltage to be inactivated. As a result, the potential of node B rises, and internal power supply voltage intVWL is pulled up to (ExtVcc−Vbe) by bipolar transistor Q11.

For example, assume that the lower limit voltage for operation of a memory cell MC manufactured for 3.3V process is 2.5V. When the voltage is lowered only by the VDC1, memory cell MC operate when external power supply voltage is 4.1V or higher, in accordance with equation (1). When VDC2 is added, memory cell MC can operate when external power supply voltage is 3.4V or higher, in accordance with equation (3). In other words, when VDC2 is used, the memory cell operation is ensured even when external power supply voltage ExtVcc lowers further by 0.7V than when VDC1 only is used.

Figure 5:
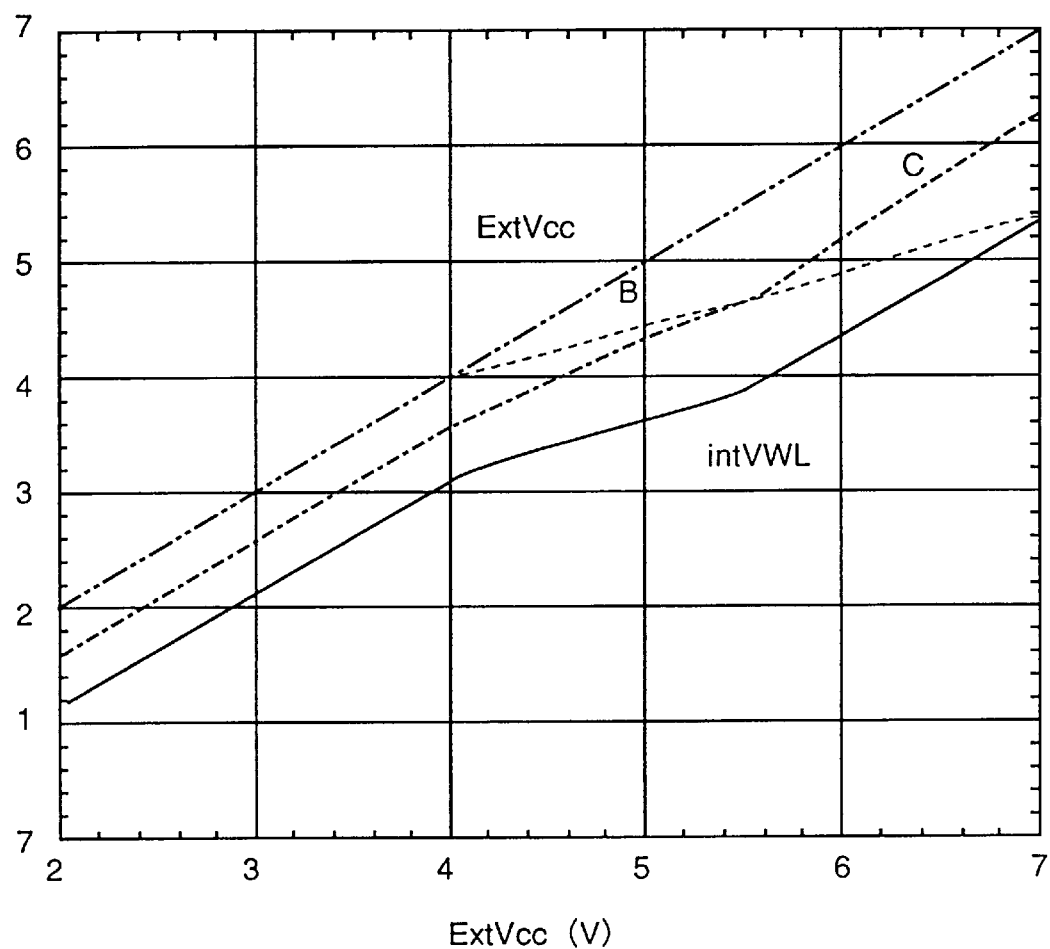
FIG. 5 shows result of simulation of the state of voltage lowering by the internal voltage down converter in accordance with an embodiment of the present invention.
Figure 6:
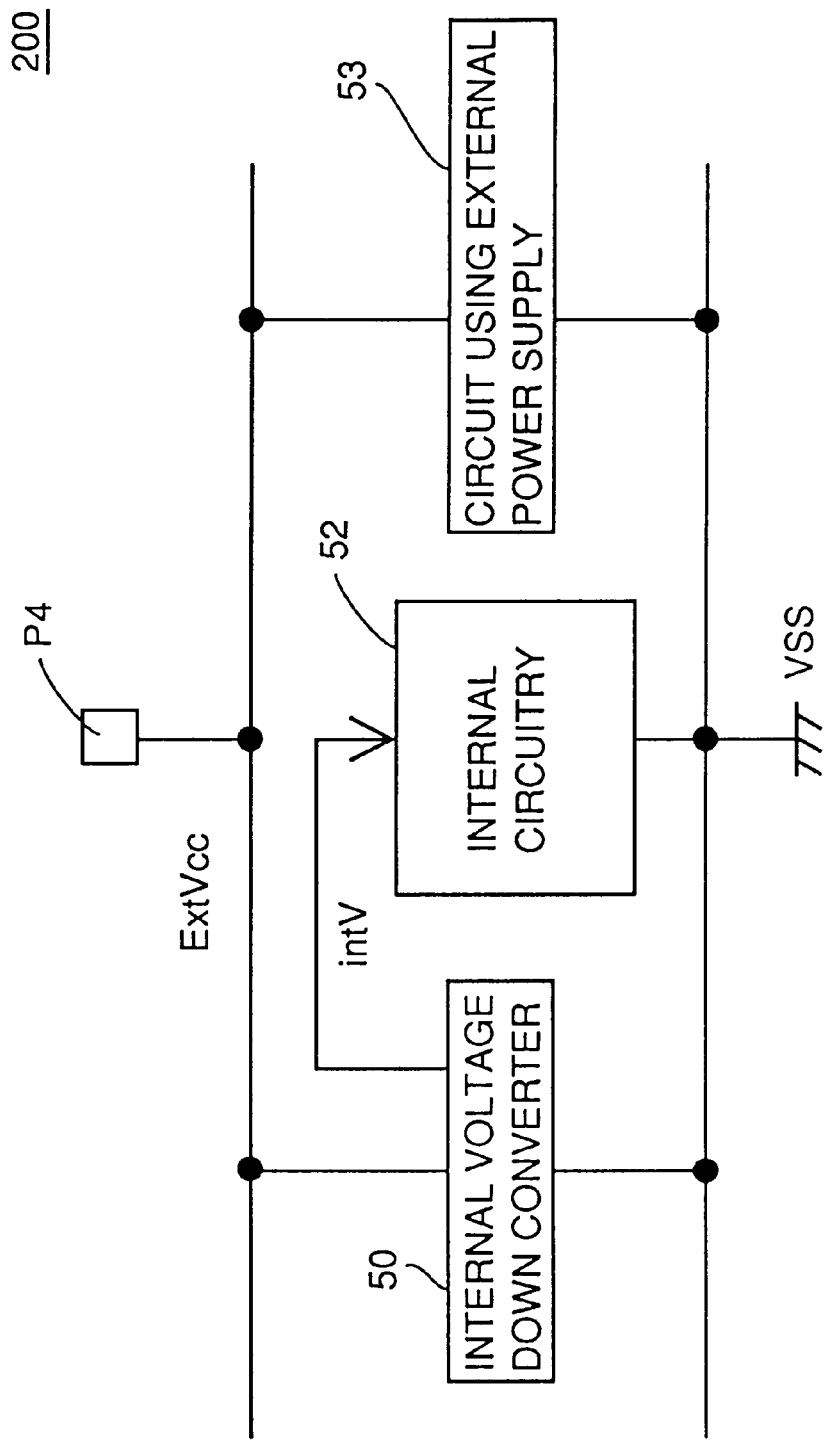
FIG. 6 is a schematic block diagram showing an overall structure of a conventional semiconductor memory device.
Figure 7:
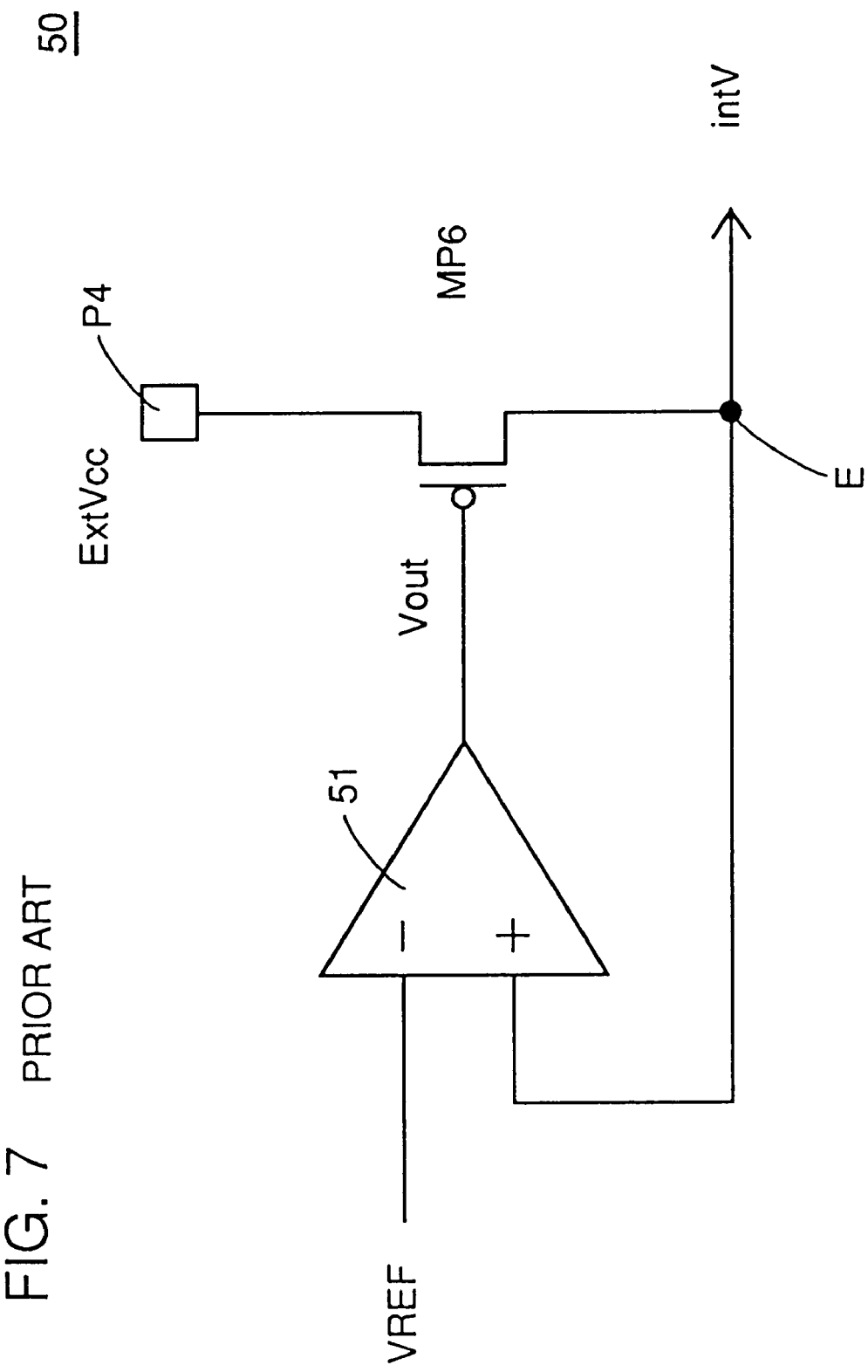
FIG. 7 is a circuit diagram schematically showing an overall structure of a conventional internal voltage down converter.

Referring to FIG. 5, simulation of voltage lowering of internal voltage down converter 2 in accordance with an embodiment of the present invention will be described.

Referring to FIG. 5, the abscissa represents the potential of external power supply voltage ExtVcc and the ordinate represents potentials at various portions. Two-dotted line represents change in the potential of the external power supply voltage, dotted line represents change in the voltage on node B of FIG. 3, chain dotted line represents change in the voltage on node c of FIG. 3 and the solid line shows change in the potential of internal power supply voltage intVWL.

As shown in FIG. 5, when external power supply voltage ExtVcc is higher than a prescribed potential, the potential on node C becomes higher than the potential on node B, and internal power supply voltage intVWL changes in accordance with the potential on node C. Meanwhile, when external power supply voltage ExtVcc becomes lower than a prescribed potential, the potential on node B becomes higher than the potential on node C, and internal power supply voltage intVWL changes in accordance with the potential on node B.

Since VDC2 does not include a feedback loop, there is no possibility of oscillation. Further, since it has a Bi-CMOS structure, it has high drivability, and allows high speed operation, high degree of integration and low current consumption.

As described above, the semiconductor memory device in accordance with the embodiment of the present invention includes a plurality of external power supply pads, and internal voltage down converters are connected to specific ones of the external power supply pads. Therefore, by selecting an external power supply pad to be used based on the external power supply at the time of bonding, the device can be used no matter what external power supply is used, and hence productivity can be improved.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device adaptable to either a first external power supply or a second external power supply providing voltage level higher than that of said first external power supply, comprising:

a plurality of first external power supply pads connected to said first external power supply when said first external power supply is used and not connected when said second external power supply is used;

at least one second external power supply pad arranged for providing connection to said first external power supply when said first external power supply is used, and for providing connection to said second external power supply when said second external power supply is used;

a plurality of internal voltage down converter means connected to said second external power supply pad for down converting voltage on said second external power supply pad for generating an internal power supply voltage, respectively;

a plurality of internal power supply lines to which output nodes of said plurality of internal voltage down converting means and said plurality of first external power supply pads are connected respectively; and a plurality of internal circuits connected to said plurality of internal power supply lines and operating receiving the voltage on said internal power supply lines; wherein connection between said first and second external power supply pads and one of said first and second external power supplies used for power supply of said semiconductor memory device is switched by bonding.

2. The semiconductor memory device according to claim 1, wherein said plurality of internal voltage down converting means includes:

first internal voltage down converting means for down converting voltage on said second external power supply pad and transmitting it to a first said internal power supply line, and second internal voltage down converting means for down converting voltage on said second external power supply pad and generating a voltage higher than a voltage output from said first internal voltage down converting means, and transmitting it to a second said internal power supply line; and said plurality of internal circuits include a circuit connected to said first internal power supply line and including a memory cell array having a plurality of memory cells arranged in a matrix, and selecting means connected to said second internal power supply line, for selecting a word line connecting said memory cells in a row direction.

3. The semiconductor memory device according to claim 2, wherein said first internal voltage down converting means includes a plurality of stages of bipolar transistors connected in series.

4. The semiconductor memory device according to claim 2, wherein said second internal voltage down converting means includes:

first voltage down converting means connected to said second external power supply pad for down converting voltage applied to said second external power supply pad and transmitting it to said second internal power supply line, detecting means for detecting lowering of the voltage on said second external power supply pad for determining voltage on a first node, second voltage down converting means connected to said first node for down converting voltage applied to said first node and transmitting it to said second internal power supply line, and control means responsive to an external control signal for adjusting current supply from said second external power supply pad to said detecting means, value of down conversion by said second down converting means being lower than that of said first down converting means.

5. The semiconductor memory device according to claim 4, wherein said detecting means sets, when said current supply from said control means exceeds a prescribed amount, voltage level on said first node to a prescribed level, and when said current supply is not higher than said prescribed amount, sets voltage level on said first node to a level in accordance with a voltage on said second external power supply pad.

6. The semiconductor memory device according to claim 4, wherein said control means includes:

switch means for performing said current supply from said second external power supply received at said second external power supply pad to said first node, and switch control means receiving said control signal for controlling said switch;

said control signal is a signal indicating access to said memory cell of said first internal circuit; and said switch means is controlled by said switch control means and stops said current supply when said control signal is inactive, and controlled by said switch control means, performs said current supply when said control signal is inactive.

7. The semiconductor memory device according to claim 4, wherein said second voltage down converting means includes:

a first plurality of stages of bipolar transistors connected in series;

said first voltage down converting means includes a second plurality of stages of bipolar transistors connected in series larger in number than the first plurality of stages; and said detecting means includes a plurality of stage of bipolar transistors connected in series between said first node and a ground node.

* * * * *